United States Patent [19]
Yang et al.

[11] Patent Number: 6,139,702
[45] Date of Patent: Oct. 31, 2000

[54] SEASONING PROCESS FOR ETCHER

[75] Inventors: Chan-Lon Yang, Taipei; Tong-Yu Chen, Hsinchu; Michael W C Huang, Taipei Hsien, all of Taiwan

[73] Assignee: United Microelectronics Corp., Taiwan

[21] Appl. No.: 09/263,386

[22] Filed: Mar. 5, 1999

[51] Int. Cl.[7] .................................................. G23C 14/34
[52] U.S. Cl. ............................... 204/192.37; 204/192.35
[58] Field of Search ........................ 204/192.32, 192.35, 204/192.37; 134/1.1

[56] References Cited

U.S. PATENT DOCUMENTS 6,014,979  1/2000  Van Autryve et al. .................. 134/1.1
6,020,641  2/2000  Lee et al. .................................. 257/755

*Primary Examiner*—Nam Nguyen
*Assistant Examiner*—Steven H. VerSteeg
*Attorney, Agent, or Firm*—Martine Penilla & Kim, LLP

[57] ABSTRACT

A seasoning process for an etcher which is performed before etching a dielectric layer to expose a metal silicide layer. The seasoning process includes the first plasma sputtering process and the second plasma sputtering process. A wafer containing the metal silicide layer thereon is placed in the etcher with an etchant and the first plasma sputtering process is performed. Several silicon wafers are successively placed in the etcher to perform the second plasma sputtering process.

11 Claims, 2 Drawing Sheets

SEASONING PROCESS FOR ETCHER

BACKGROUND OF THE INVENTION

1. Field of the Invention

The invention relates to a process of chamber condition control for an etcher, and more particularly to a seasoning process for the etcher.

2. Description of the Related Art

Dielectrics material is widely used in integrated circuits; therefore, it is more often etched than other materials during the semiconductor processes. $CF_x$ plasma is often used to perform dry etching on the dielectrics material, in which etching process the high-energy electrons in the plasma bombard the $CF_x$ gas to generate various ions or atoms. The fluorine atoms or ions produced by ion bombardment react with the silicon atoms of the dielectrics material to form a volatile compound. Using the fluorine atoms in the $CF_x$ plasma and properly adjusting the ion bombardment on the thin film on the wafer and the polymer, the dielectrics material is therefore etched. However, when the amount of polymers exceeds the ion bombardment from the plasma, a polymer is formed on the wafer, which retards the etching process for the dielectrics material.

In order to enhance the conductivity of the polysilicon layer during fabrication of the semiconductor process, a titanium silicide layer 102 is often formed on a substrate 100, as shown in FIG. 1, and the substrate 100 is then covered with a silicon oxide layer 104. The silicon oxide layer 104 is then etched to form a contact window 106 or a test key 108, both of which expose the titanium silicide ($TiSi_x$) 102. The etching process for the silicon oxide layer 104 is carried out by an inductive coupled plasma high density plasma etcher (ICP HDP etcher), so that it is necessary to balance the ion bombardment and the amounts of the polymer 110 deposition to achieve a good etching process performance. After a number of wafers undergo the foregoing process, including etching the dielectric layer 104 to expose the titanium silicide layer 102, it is found that the chamber conditions in the etcher gradually change, which causes the etching to stop. From the previous process characterizations and material analysis, the changes in the process conditions are caused by exposed $TiSi_x$ films sputtering onto an ICP source dome area, which sputtering affects the RF coupling of the inductive coupled plasma. This, in turn, results in the destruction of the balance between the ion bombardment and the amounts of the polymers 110 deposited on the wafer surface. This imbalance leads to polymer formation exceeding the ion bombardment and, as a result, the etching process for forming the contact window 106 or the test key 108 cannot be successfully performed. In addition, the change in chamber conditions also causes etching rates and etching selectivity to shift, resulting in an inability to etch the dielectric layer 104 prior to exposing the $TiSi_x$ 102. Therefore, the etching process to form the contact window 106 or the test key 108 fails.

SUMMARY OF THE INVENTION

The invention provides a seasoning process for an etcher, which seasoning process can overcome the shift in the chamber conditions and thus enable a smooth performance of an etching process.

To achieve these objects and advantages, and in accordance with the purpose of the invention, as embodied and broadly described herein, the invention is directed towards a seasoning process for an etcher, which seasoning process is used prior to the formation of an opening within a dielectric layer for the purpose of exposing a metal silicide layer. The seasoning process includes pumping an etching gas into an etcher and providing at least one wafer containing a metal silicide layer thereon to perform a first plasma sputtering process. Then, several silicon wafers are provided to perform a second plasma sputtering with the same etching recipe in the etcher. When the seasoning process is carried out, the chamber conditions become more stable, which enhances the reliability of the etching process.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
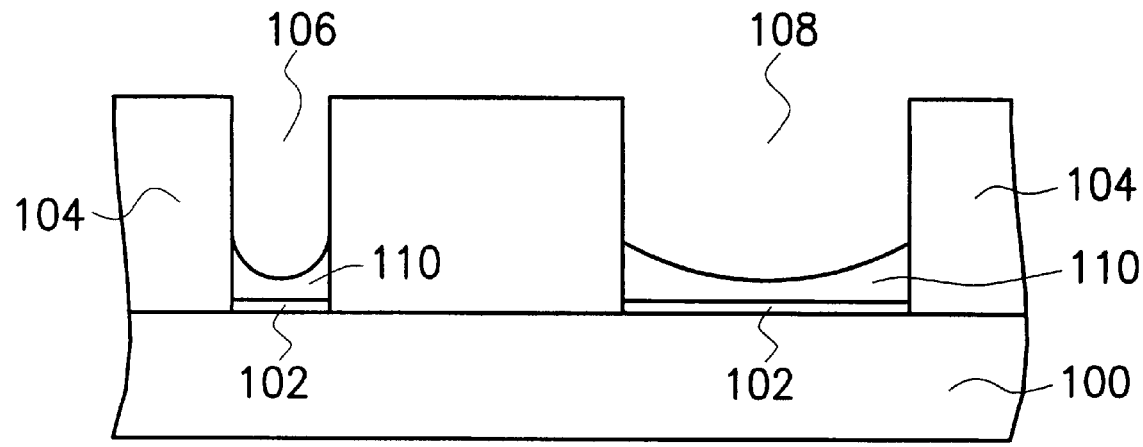
FIG. 1 is a schematic, cross-sectional view of a contact window and a test key as known in prior art.

Reference will now be made in detail to the present preferred embodiments of the invention, examples of which are illustrated in the accompanying drawings. Wherever possible, the same reference numbers are used in the drawings and the description to refer to the same or like parts.

In order to avoid the shifting of the chamber conditions, which leads to a failure of the etching process, a seasoning process for the etcher is provided for use prior to the etching process. The seasoning process uses at least a wafer having a metal silicide film ($TiSi_x$, $WSi_x$) thereon and the silicon wafers, which are successively placed in the etcher. The metal silicide film ($TiSi_x$, $WSi_x$) is sputtered to form a coating film on the chamber wall, thereby stabilizing the chamber condition and ensuring the smooth performance of the etching process.

Figure 2:
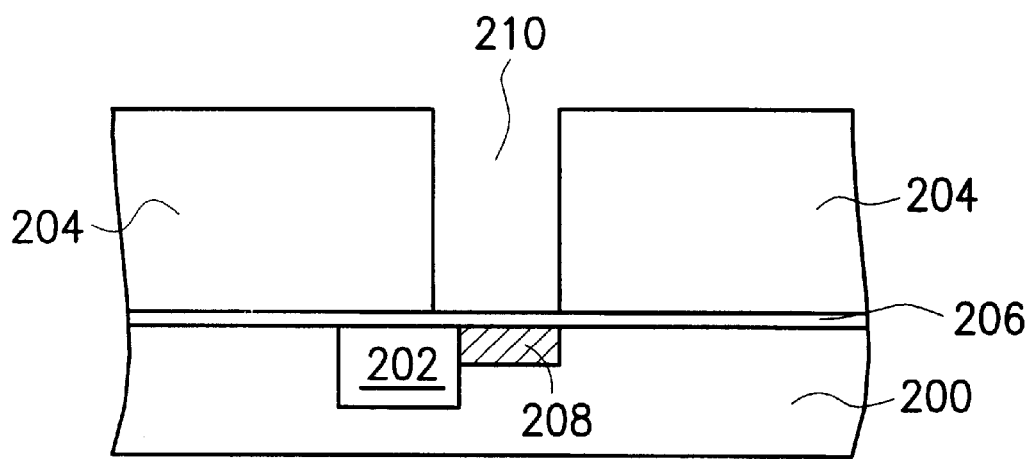
FIG. 2 is a schematic, cross-sectional view of a borderless contact window formed according to a preferred embodiment of the invention.

An etching process for a borderless contact window is used as an example in this invention to describe the seasoning process for an etcher, but this invention is not restricted by the embodiment. FIG. 2 illustrates a schematic, cross-sectional view of a borderless contact window.

Referring to FIG. 2, the borderless contact uses a portion of a contact window 210 formed on a shallow trench isolation (STI) 202, such that the integration of devices is increased in a finite space and within the limitation of the design rule. However, since the dielectric layer 204 and the STI 202 are both made of silicon oxide, the STI 202 is easily eroded by an etchant while etching the dielectric layer 204. Accordingly, a silicon nitride layer 206 serving as an etching stop layer for etching the dielectric layer 204 is formed on the substrate 200 prior to the formation of the dielectric layer 204. Then, the silicon nitride layer 206 is etched to expose the titanium silicide 208.

To enhance the etching selectivity of the silicon oxide layer 204 and the silicon nitride layer 206, the etchants for etching the dielectric layer 204 and the silicon nitride layer 206 include a gas mixture of $C_4F_8$, Ar and/or CO to be pumped into the chamber at a high chamber wall temperature and a low ambient pressure. Although the $SiO_2/SiN$ selectivity increases with high chamber wall temperature, the fluorine species resulting from dissociation of $C_4F_8$ in high density plasma are reduced. When a number of wafers with silicide film ($TiSi_x$, $WSi_x$) exposed during dielectric etching have undergone the foregoing process, the chamber wall is coated with etched/sputtered metal silicide ($TiSi_x$, $WSi_x$) film from exposed area on the wafer. This changes the balances of polymers deposited and the amounts of the ion bombardment, and as a result, the etching process for the silicon oxide layer 204 and silicon nitride layer 206 stops.

Therefore, a seasoning process is carried out for controlling the condition the chamber of the etcher. The chamber is full of an etchant including $C_4F_8$, Ar and CO, for example. A wafer surface having a titanium silicide layer thereon is placed in the chamber and a first sputtering plasma process is performed. A number of blank silicon wafers are then placed in the chamber and a second sputtering plasma process is performed with the same etchant. To control the sputtering film amount and avoid particle formation, the sputtering time and seasoning wafers are optimized by TXRF (Time Based Fluorescence X-ray Microscopy) measurements and monitor wafers. With respect to the chamber seasoning process, the borderless contact etch base line shifts to lower polymer condition with a larger process window for etching selectivity and flow rate of the etchants.

The seasoning process of the chamber condition for etching a borderless contact window to expose a titanium silicide uses a wafer having a titanium silicide layer thereon which is placed in the chamber. After this wafer having a titanium silicide layer thereon is placed in the chamber, sputtering is performed for about at least 10 seconds with an etchant of $C_4F_8$/Ar/CO, for example. The wafer having the titanium silicide layer thereon is then taken out. Several silicon wafers, for example, at least one, are then successively placed in the chamber to be sputtered for at least about 10 seconds. The silicon wafer is taken out. The forgoing sputtering processes are alternately performed at least about 1 time to obtain a stable chamber condition for the etcher. The selectivity of the etching processes for the borderless contact is then stabilized. The flow rate of $C_4F_8$ is reduced from 20 sccm (standard cubic centimeter per minute) of prior art to 18 sccm and the etch stop window is increased from 2 sccm of prior art to 4 sccm. In addition, the etching depth of the borderless contact window 210 can approach 15,000 Å.

This invention also can be applied prior to an etching process including etching a dielectric layer to form an opening. Such openings include a contact window, a via opening or a test key to expose a metal silicide layer, such as titanium silicide or tungsten silicide, because it possibly causes a failure of the etching process due to changes in the chamber conditions. Simultaneously, the wafers having a metal silicide layer thereon and the silicon wafers successively undergo a plasma sputtering process in the chamber with an etchant for the etching process. The sputtering time, the amounts of the wafers having the metal silicide layer and the silicon wafers and the alternate frequency are decided by the test results. After the seasoning process, the chamber condition of the etcher is in a stable state, such that the reliability and repeatability of the etching process is improved.

Figure 3:
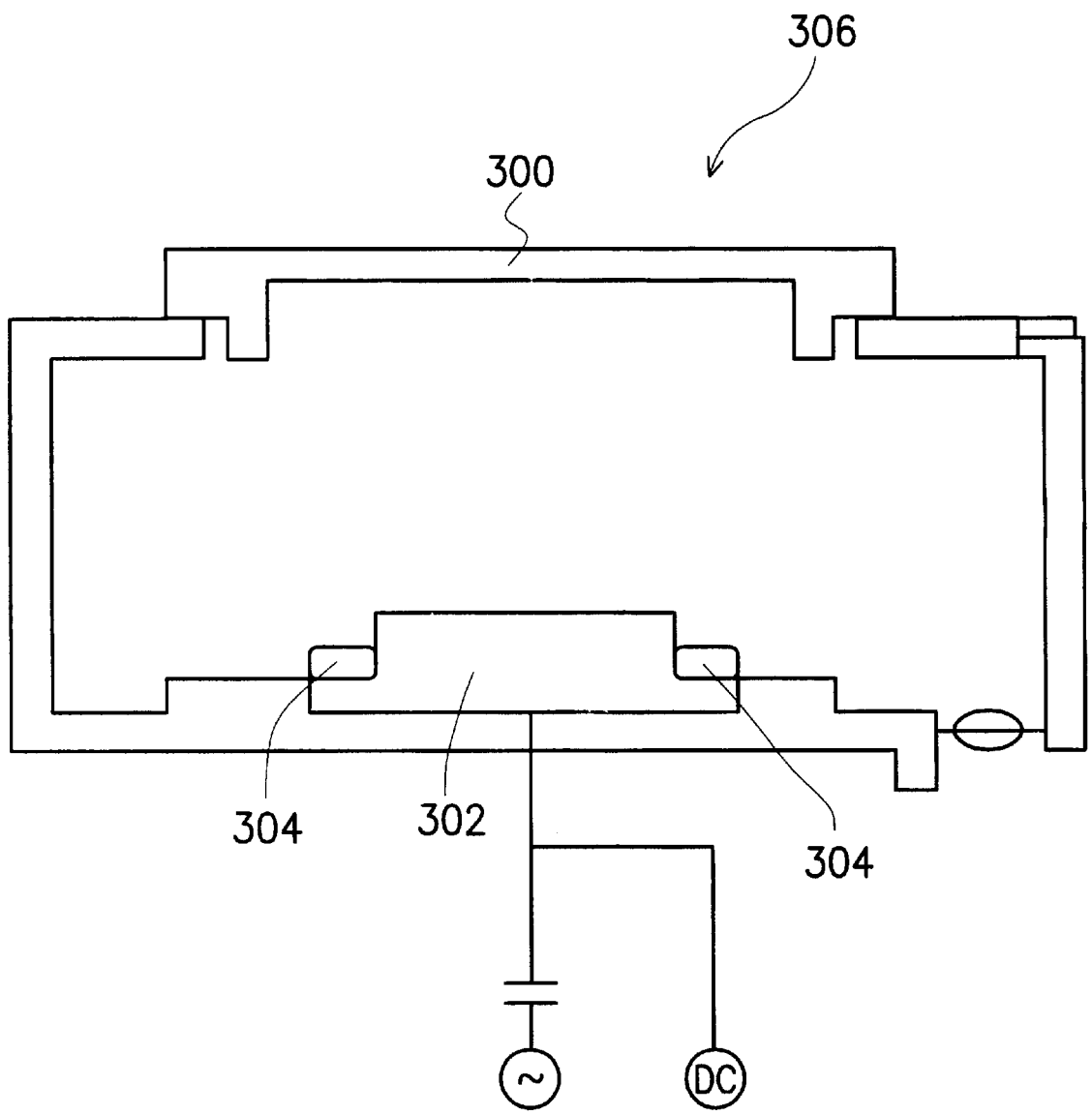
FIG. 3 is a cross sectional view of an inductively coupled plasma high density plasma etcher according to a preferred embodiment of this invention.

This invention, for example, utilizes an inductively coupled plasma (ICP) etcher 306, as shown in FIG. 3, to generate high density plasma to employ the seasoning process for the etcher 306 with a susceptor 302. A mixture gases, such as $C_4F_8$/Ar/CO, $C_4F_8$/Ar, $C_4F_8/C_2F_6$Ar/CO or $C_4F_8/C_2F_6$/Ar is used as the etchant. When $C_4F_8$/Ar/CO or $C_4F_8$/Ar is used, the flow rate of $C_4F_8$ is controlled of about 10–20 sccm, the flow rate of CO is about 1–100 sccm and Ar is about 50–500 sccm. When $C_4F_8/C_2F_6$/Ar/CO or $C_4F_8/C_2F_6$/Ar is utilized, a ratio of the flow rate of $C_4F_8/C_2F_6$ is approximately 0.5–1.5. The roof 300 temperature of the etcher is about 150–300° C., the ring 304 temperature is about 150–400° C. and the ambient pressure is about 4–100 mTorr, for example.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A seasoning process for an etcher, which seasoning process is performed prior to etching a dielectric layer to expose a metal silicide, comprising:

performing a first plasma sputter etching process by placing at least one wafer having an exposed metal silicide layer thereon in the etcher with an etchant, the exposed metal silicide layer being sputter etched to form a silicide coating film on a wall of the etcher; and performing a second plasma sputter etching process on at least one blank silicon wafer placed in the etcher.

2. The process according to claim 1, wherein said at least one wafer comprises a plurality of wafers having the metal silicide layer thereon.

3. The process according to claim 1, wherein the wafer having the metal silicide layer thereon is in the etcher for at least 10 seconds.

4. The process according to claim 1, wherein said at least one blank silicon wafer comprises a plurality of blank silicon wafers.

5. The process according to claim 1, wherein each of the blank silicon wafers is in the etcher for at least 10 seconds.

6. The process according to claim 1, wherein at least 1 repetition of the first plasma sputter etching process and the second plasma sputter etching process is alternately performed.

7. The process according to claim 1, wherein the etchant includes a gas mixture selected from the group consisting of $C_4F_8$/Ar/CO, $C_4F_8$/Ar, $C_4F_8/C_2F_6$/Ar/CO and $C_4F_8/C_2F_6$/Ar.

8. The process according to claim 7, wherein a flow rate of $C_4F_8$, a flow rate of CO and a flow rate of Ar are in a range of about 10–20 sccm, 1–100 sccm and 50–500 sccm, respectively.

9. The process according to claim 7, wherein the ratio of $C_4F_8/C_2F_6$ is in a range of about 0.5–1.5.

10. The process according to claim 1, wherein the plasma sputter etching processes are by performed by an inductive coupled plasma (ICP) etcher.

11. The process according to claim 10, wherein the ICP has a roof temperature in a range of about 150–300° C., a ring temperature of about 150–300° C. and an ambient pressure of about 4–100 mTorr.

* * * * *